(12) United States Patent  
Fukumoto

(10) Patent No.: US 7,561,442 B2  
(45) Date of Patent: Jul. 14, 2009

(54) ELECTRONIC COMPONENT HOLDER

(75) Inventor: Yasuyuki Fukumoto, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 124 days.

(21) Appl. No.: 11/751,227

(22) Filed: May 21, 2007

(65) Prior Publication Data

US 2007/0274057 A1    Nov. 29, 2007

(30) Foreign Application Priority Data

May 24, 2006  (JP) .............................. 2006-144022

(51) Int. Cl.  
*H05K 7/02* (2006.01)

(52) U.S. Cl. .................. 361/807; 361/809; 361/810; 174/138 G

(58) Field of Classification Search .............. 361/807, 361/809, 810; 174/138 G  
See application file for complete search history.

(56) References Cited

U.S. PATENT DOCUMENTS

| | | | | |
|---|---|---|---|---|
| 4,802,860 A | * | 2/1989 | Kikuta | .................. 439/79 |
| 5,426,265 A | * | 6/1995 | Savage, Jr. | ............... 174/138 G |
| 5,999,400 A | * | 12/1999 | Belopolsky et al. | .......... 361/600 |
| 6,174,194 B1 | * | 1/2001 | Bleicher et al. | ............. 439/490 |
| 6,224,417 B1 | * | 5/2001 | Belopolsky et al. | .......... 439/490 |
| 6,431,906 B1 | * | 8/2002 | Belopolsky | .................. 439/490 |
| 7,019,220 B2 | * | 3/2006 | Takeuchi | ................. 174/138 G |

FOREIGN PATENT DOCUMENTS

| | | |
|---|---|---|
| JP | 05-251876 | 9/1993 |
| JP | 10-322053 | 12/1998 |
| JP | 2001-077558 | 3/2001 |

* cited by examiner

*Primary Examiner*—Dameon E Levi  
(74) *Attorney, Agent, or Firm*—Global IP Counselors, LLP

(57) ABSTRACT

An electronic component holder includes a holder body and a wire retaining portion. The holder body includes a plurality of first grooves formed in a top face of the holder body and a plurality of second grooves formed in a back face of the holder body. The first grooves and the second grooves are configured to receive a lead wire of an electronic component. The lead wire is configured to be bent to be disposed in one of the second grooves. The back face intersects with the top face. The wire retaining portion is provided to the holder body. The wire retaining portion is configured to engage the lead wire to retain the lead wire in the second grooves.

8 Claims, 5 Drawing Sheets

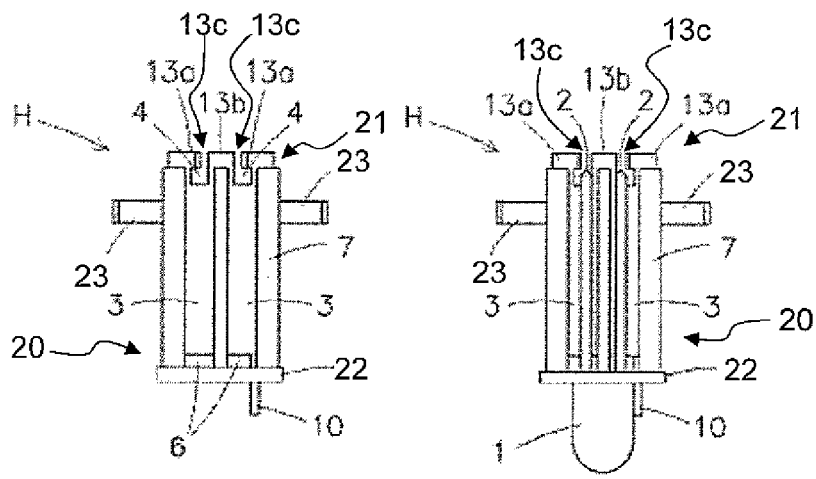
*Fig. 3a*  *Fig. 3b*
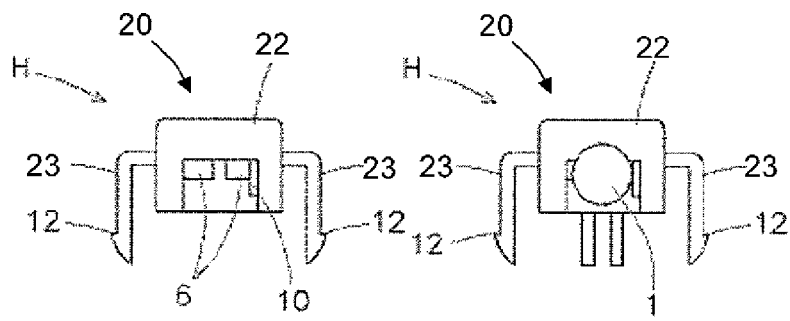
*Fig. 4a*  *Fig. 4b*
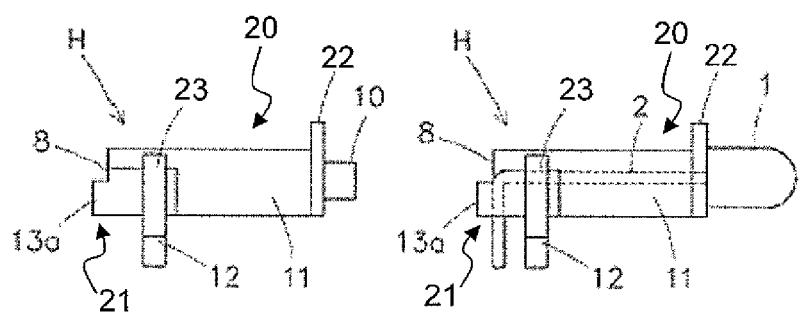
*Fig. 5a*  *Fig. 5b*

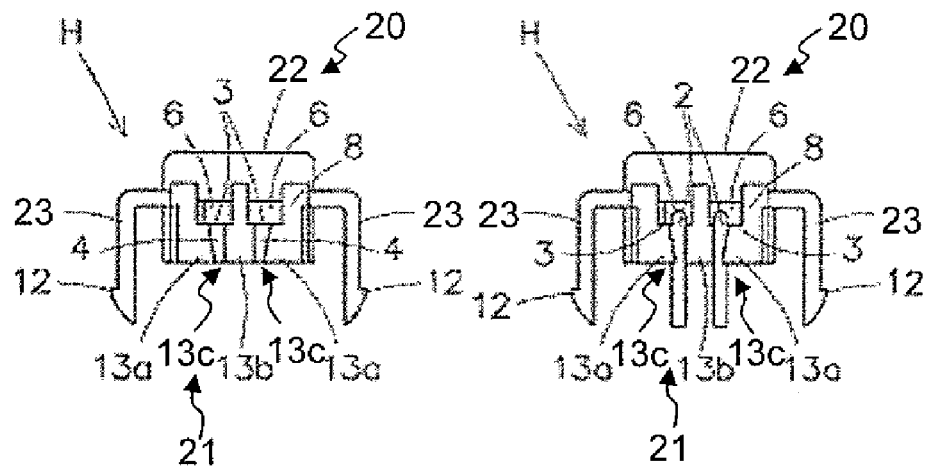
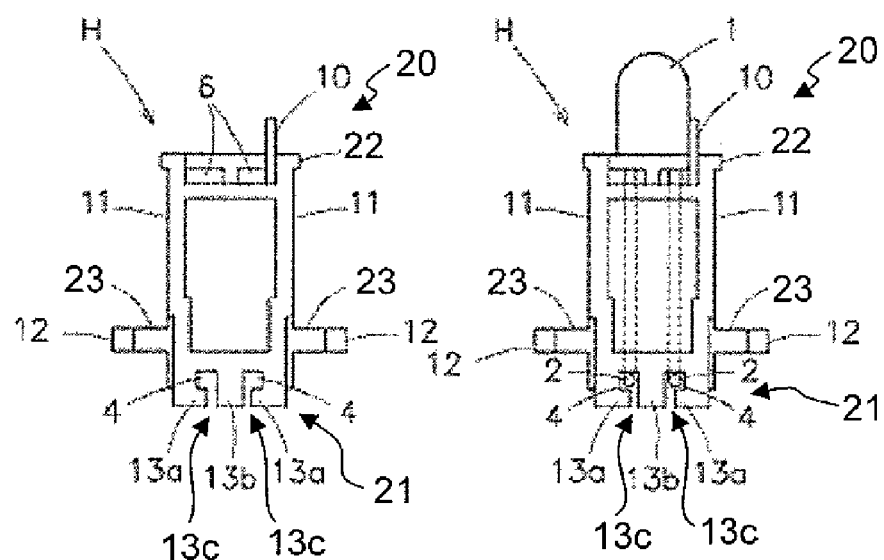
Fig. 6a    Fig. 6b
Fig. 7a    Fig. 7b

ELECTRONIC COMPONENT HOLDER

CROSS-REFERENCE TO RELATED APPLICATIONS

This application claims priority to Japanese Patent Application No. 2006-144022 filed on May 24, 2006. The entire disclosure of Japanese Patent Application No. 2006-144022 is hereby incorporated herein by reference.

BACKGROUND OF THE INVENTION

1. Field of the Invention

The present invention generally relates to an electronic component holder. More specifically, the present invention relates to an electronic component holder that holds LEDs or other such electronic components so as not to fall out.

2. Background Information

FIGS. 10-12 show a conventional electronic component holder H1 used to mount an LED 101 to a printed wiring board of a remote control. As shown in FIG. 10, the electronic component holder H1 has a holder body 120 and a pair of left and right inverted L-shaped legs 123. The holder body 120 has two horizontal grooves 103 and two vertical grooves 104. The two horizontal grooves 103 are formed in a top face of the holder body 120. Two lead wires 102 of the LED 101 are passed through openings 106 in a front face of the holder body 120 and are disposed in the two horizontal grooves 103. As shown in FIG. 11, the two vertical grooves 104 are formed in a back face of the holder body 120. The two lead wires 102 are bent at a substantially right angle and disposed in the two vertical grooves 104. The legs 123 are provided to both side faces of the holder body 120. The legs 123 protrude from the side faces of the holder body 120. Distal ends of the legs 123 are fixedly attached to the printed wiring board.

With the electronic component holder H1, the lead wires 102 of the LED 101 are not fixed in either the horizontal grooves 103 or the vertical grooves 104. Therefore, as shown in FIG. 12, during the course of mounting the LED 101 to a printed wiring board, the lead wires 102 of the LED 101 would lift up from the horizontal grooves 103 and the vertical grooves 104. Thus, the lead wires 102 come out through the openings 106 in the holder front face causing the LED 101 to readily fall out of the holder H1. Consequently, this lowers the efficiency in mounting the LED 101 with the electronic component holder H1 to the printed wiring board. In addition, accurate positioning of the LED 101 in the fore and aft direction is difficult.

Meanwhile, another conventional electronic component attachment device has a socket and a contact member (See Japanese Laid-Open Patent Application H05-251876, for example). The socket has insertion holes in which lead terminals of an electronic component are inserted. The contact member is formed in the insertion holes. The contact member includes a pair of spring catches. The pair of spring catches hold the lead terminals elastically.

With the electronic component attachment device, the lead terminals of the electronic component are elastically held by the pair of spring catches fitted inside the insertion holes of the socket to prevent the electronic component from falling out of the socket. However, the contact member including the spring catches has to be formed and fitted into the insertion holes of the socket along with inserting the lead terminals of the electronic component. This increases the number of parts required, drives up the cost of manufacturing, and also increases assembly time. Consequently, this lowers manufacturing efficiency.

In view of the above, it will be apparent to those skilled in the art from this disclosure that there exists a need for an improved electronic component holder. This invention addresses this need in the art as well as other needs, which will become apparent to those skilled in the art from this disclosure.

SUMMARY OF THE INVENTION

The present invention was conceived in light of the above situation. One object of the present invention is to provide an electronic component holder with which an electronic component is simply and securely held.

In accordance with one aspect of the present invention, an electronic component holder includes a holder body and a wire retaining portion. The holder body includes a plurality of first grooves formed in a top face of the holder body and a plurality of second grooves formed in a back face of the holder body. The first grooves and the second grooves are configured to receive a lead wire of an electronic component. The lead wire is configured to be bent to be disposed in one of the second grooves. The back face intersects with the top face. The wire retaining portion is provided to the holder body. The wire retaining portion is configured to engage the lead wire to retain the lead wire in the second grooves.

Since the wire retaining portion is provided to the electronic component holder, the electronic component is simply and securely held with the electronic component holder.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure:

FIG. 3a is a plan view of the electronic component holder;

FIG. 3b is a plan view of the electronic component holder holding the LED;

FIG. 4a is a front view of the electronic component holder;

FIG. 4b is a front view of the electronic component holder holding the LED;

FIG. 5a is a left side view of the electronic component holder;

FIG. 5b is a left side view of the electronic component holder holding the LED;

FIG. 6a is a rear view of the electronic component holder;

FIG. 6b is a rear view of the electronic component holder holding the LED;

FIG. 7a is a bottom view of the electronic component holder;

FIG. 7b is a bottom view of the electronic component holder holding the LED;

DETAILED DESCRIPTION OF THE PREFERRED EMBODIMENTS

Figure 1:
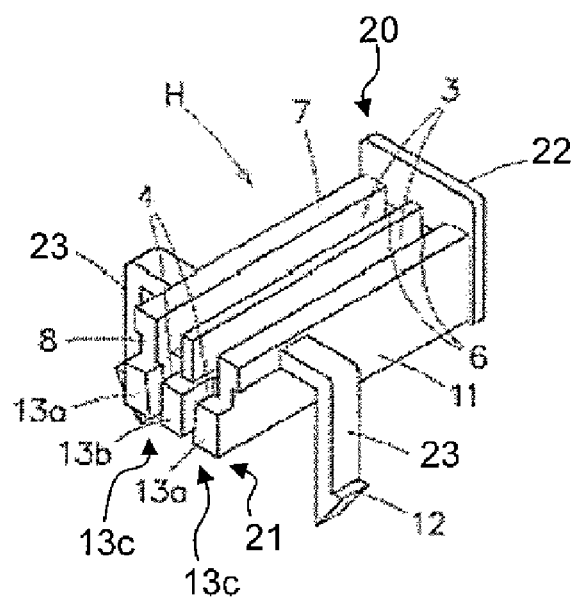
FIG. 1 is an oblique view of an electronic component holder pertaining to an embodiment of the present invention.

A preferred embodiment of the present invention will now be explained with reference to the drawings. It will be apparent to those skilled in the art from this disclosure that the following description of the preferred embodiment of the present invention is provided for illustration only and not for the purpose of limiting the invention as defined by the appended claims and their equivalents.

As shown in FIGS. 1-8, an electronic component holder H of the present invention is configured to hold two lead wires 2 of an LED 1 or other such electronic component. The electronic component holder H is a molded article that is substantially cuboid in shape. Furthermore, the electronic component holder H is obtained by injection molding a thermoplastic synthetic resin.

The electronic component holder H has a holder body 20, a wire retaining portion 21, an inverted U-shaped support plate 22 and a pair of left and right inverted L-shaped legs 23.

The holder body 20 includes a plurality of horizontal grooves or first grooves 3 and a plurality of vertical grooves or second grooves 4. The horizontal grooves 3 are formed in a top face 7 of the holder body 20. The horizontal grooves 3 open to a front side of the holder body 20 and extend horizontally and longitudinally in the top face 7. The vertical grooves 4 are formed in a back face 8 of the holder body 20. The back face 8 intersects the top face 7. The vertical grooves 4 extend downwardly from rear ends of the horizontal grooves 3. Preferably, the vertical grooves 4 extend substantially perpendicular to the horizontal grooves 3.

The horizontal grooves 3 and the vertical grooves 4 are configured to receive the lead wires 2. Specifically, distal ends of the lead wires 2 disposed in the horizontal grooves 3 are bent at a substantially right angle at the rear ends of the horizontal grooves 3 to be disposed in the vertical grooves 4.

Figure 8:
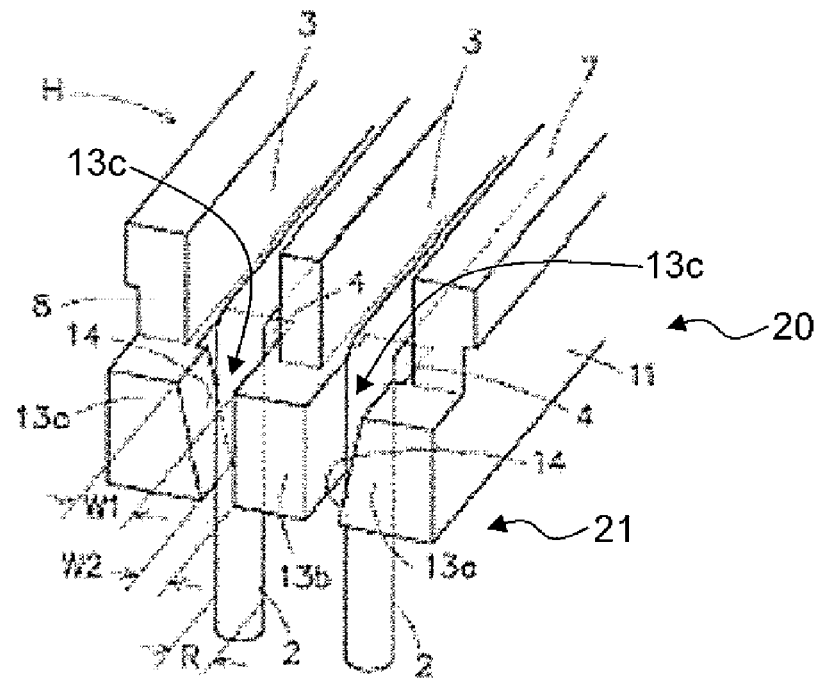
FIG. 8 is a detail oblique view of the rear part of the electronic component holder holding the LED.

The wire retaining portion 21 of the electronic component holder H is provided to the back face 8 of the holder body 20. The wire retaining portion 21 is configured to engage the lead wires 2 from a rear side of the holder body 20 to retain the lead wires 2 in the vertical grooves 4. The wire retaining portion 21 includes a plurality of side ribs or protrusions 13a and a center rib 13b. The side ribs 13a and the center rib 13b are preferably made of synthetic resin, for example. The side ribs 13a and the center rib 13b are integrally molded along the vertical grooves 4. Referring to FIGS. 3a and 3b, the side ribs 13a protrude inwardly from outer side faces of the vertical grooves 4 toward both side faces of the center rib 13b. Specifically, referring to FIG. 8, the side ribs 13a have sloped faces 14 that slope downwardly and inwardly. In other words, the sloped faces 14 protrude to the inside of the vertical grooves 4 progressively from a top to a bottom of the vertical grooves 4. The side faces of the center rib 13b constitute inner side faces of the vertical grooves 4. The wire retaining portion 21 further includes a plurality of gaps 13c. The gaps 13c are defined between the sloped faces 14 of the side ribs 13a and the inner side faces of the vertical grooves 4. Specifically, gap widths of the gaps 13c decrease downwardly. In particular, as shown in FIG. 8, gap widths W1 at a top of the gaps 13c are greater than diameters R of the lead wires 2. Furthermore, gap widths W2 at a bottom of the gaps 13c are less than the diameters R of the lead wires 2.

With the wire retaining portion 21, once the lead wires 2 are bent and pushed into the vertical grooves 4 through the gaps 13c, the side ribs 13b latch the lead wires 2 so that the lead wires 2 do not deviate from the vertical grooves 4.

The inverted U-shaped support plate 22 of the electronic component holder H is configured to support the LED 1 from a rear end of the LED 1. The support plate 22 is integrally molded on the front side of the holder body 20. The support plate 22 has a protrusion 10 that positions the LED 1 by contacting a side of the LED 1. Specifically, the protrusion 10 is configured to protrude forward on one side of the support plate 22. Referring to FIGS. 4a and 4b, the horizontal grooves 3 open to the front side of the holder body 20 through the support plate 22. A plurality of openings 6 (preferably two openings 6) that communicate with the horizontal grooves 3 are defined in the front side of the holder body 20. The lead wires 2 of the LED 1 are inserted into the openings 6 which lead to the horizontal grooves 3.

Figure 2:
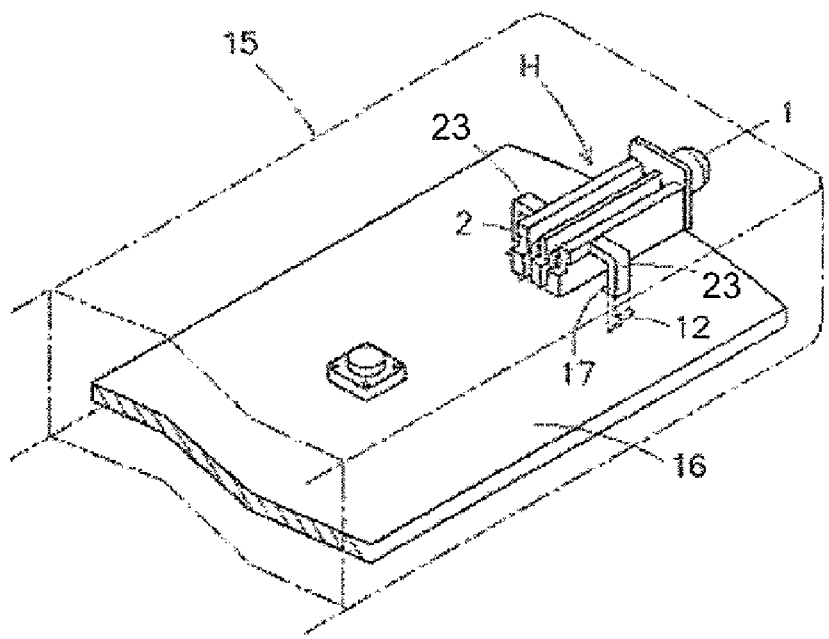
FIG. 2 is an oblique view of the electronic component holder in a state that the electronic component holder holding an LED is attached to a printed wiring board.

The pair of left and right inverted L-shaped legs 23 of the electronic component holder H are integrally molded on left and right side faces 11 of the holder body 20. The legs 23 protrude from the left and right side faces 11 of the holder body 20. A latching prong 12 is formed at a bottom end of each of the legs 23. As shown in FIG. 2, the legs 23 are configured to attach and fix the electronic component holder H to a printed wiring board 16 of a remote control 15 by latching the latching prongs 12 to the printed wiring board 16.

Figure 9:
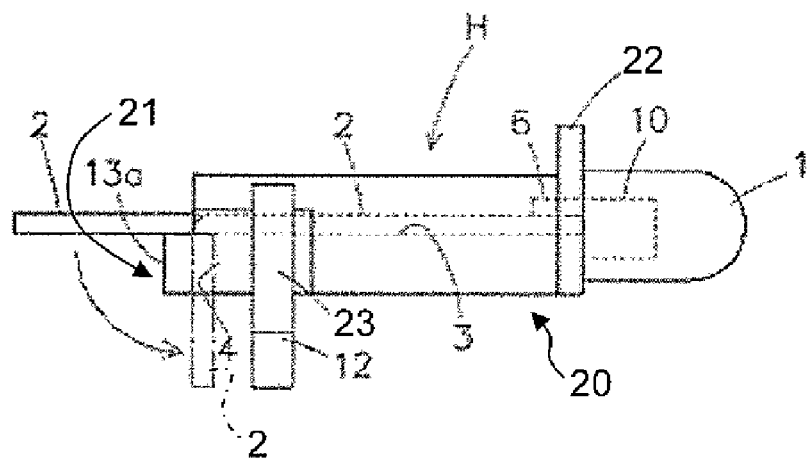
FIG. 9 is a diagram of a procedure for holding the LED in the electronic component holder.
Figure 10:
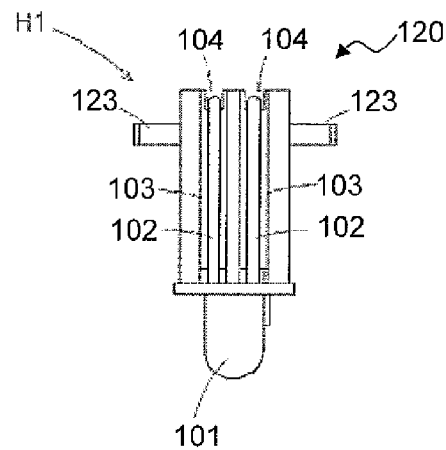
FIG. 10 is a plan view of a conventional electronic component holder holding an LED.
Figure 11:
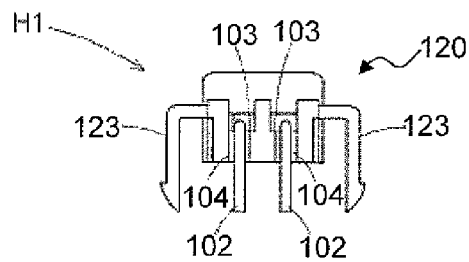
FIG. 11 is a rear view of the conventional electronic component holder holding the LED.
Figure 12:
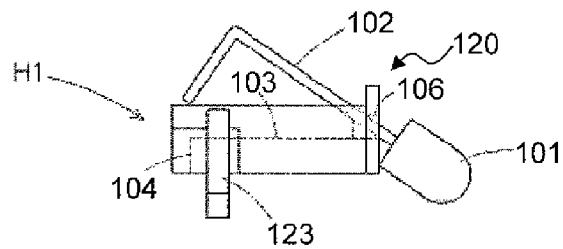
FIG. 12 is a diagram illustrating problems associated with the conventional electronic component holder.

When the LED 1 is installed in the electronic component holder H, the lead wires 2 of the LED 1 are inserted in the openings 6, and are passed through the horizontal grooves 3 in the top face 7 of the holder body. The LED 1 is positioned so that the LED 1 is supported from the rear by the support plate 22. Furthermore, a side face of the LED 1 is positioned by contacting with the protrusion 10. Then, as shown by the imaginary lines in FIG. 9, distal ends of the lead wires 2 are bent downward at a substantially light angle, and pushed into the vertical grooves 4 through the gaps 13c. Specifically, the lead wires 2 are pushed into the gaps 13c from the tops of the gaps 13c, which have wide gap widths, into the bottoms of the gaps 13c, which have narrow gap widths. The side ribs 13a are elastically spread apart from the side faces of the center rib 13b by the lead wires 2 passing through the bottoms of the gaps 13c. After the lead wires 2 pass through the bottoms of the gaps 13c, the side ribs 13a elastically change back as before. Accordingly, the side ribs 13a engage the lead wires 2 to prevent the lead wires 2 from coming out of the vertical grooves 4.

In this case, since the side ribs 13a have the sloped faces 14, pushing the lead wires 2 into the vertical grooves 4 can be easily accomplished by using the sloped faces 14 to smoothly spread apart the side ribs 13a with the lead wires 2. Because, the gap widths W1 are greater than diameters R of the lead wires 2 and the gap widths W2 are less than the diameters R of the lead wires 2, the lead wires 2 are fit into the gaps 13c without resistance at the top of the wire retaining portion 21. Then, the lead wires 2 are easily disposed in the vertical grooves 4 by elastically spreading the bottom of the wire retaining portion 21.

When the lead wires 2 are retained in the vertical grooves 4, the lead wires 2 are effectively prevented from lifting up from the horizontal grooves 3 or from the vertical grooves 4. Moreover, the LED 1 is prevented from coming loose and falling out from the openings 6. Also, since there is no misalignment of the LED 1 in the fore and aft direction, the LED 1 is positioned more accurately.

As shown in FIG. 2, the electronic component holder H1 holding the LED 1 is mounted on the printed wiring board 16 of the remote control 15. Lower parts of the legs 23 are inserted into attachment holes 17 formed in the printed wiring board 16, and the latching prongs 12 formed at bottom ends of the legs 23 latch onto a rear face of the board 16 to mount the electronic component holder H on the printed wiring board 16. The lead wires 2 of the LED 1 are inserted into through-holes in the printed wiring board 16 and soldered. In this case, since the lead wires 2 of the LED 1 are retained in the vertical grooves 4 of the electronic component holder H, the LED 1 will not fall out during assembly. This improves the efficiency of the work of holding the LED 1 in the electronic component holder H and mounting the LED 1 and the electronic component holder H to the printed wiring board 16.

Also, because the electronic component holder H has the side ribs 13a and the center rib 13b integrally molded by injection molding, there is no increase in the number of parts or assembly time. In addition, since it is inexpensive to change the metal mold used to provide the wire retaining portion 21, there is substantially no increase in manufacturing cost.

Also, with the electronic component holder H, a service life of a metal mold for the electronic component holder H is extended since the side ribs 13a are provided only on outer side faces of the vertical grooves 4. Generally, if there are more places where sharp edge portions are formed, the metal mold will tend to wear faster and the service life will be shortened. With the electronic component holder H, the side ribs 13a having such sharp edge portions are formed only on outer side faces of the vertical grooves 4. Therefore, the metal mold has a longer service life than when sharp edges are formed on both outer and inner side faces of vertical grooves. It will be apparent to one of ordinary skill in the art from this disclosure that the center rib 13b may have sloped faces on both side faces.

Note that the lead wires 2 may be clamped and fixed within the gaps 13c by the elasticity of the side ribs 13a and the center rib 13h. In this case, the lead wires 2 are securely fixed to the electronic component holder H.

GENERAL INTERPRETATION OF TERMS

In understanding the scope of the present invention, the term "comprising" and its derivatives, as used herein, are intended to be open ended terms that specify the presence of the stated features, elements, components and groups, but do not exclude the presence of other unstated features, elements, components and groups. The foregoing also applies to words having similar meanings such as the terms, "including", "having" and their derivatives. Also, the terms "part," "section," "portion," "member" or "element" when used in the singular can have the dual meaning of a single part or a plurality of parts. As used herein to describe the present invention, the following directional terms "forward, rearward, above, downward, vertical, horizontal, below and transverse" as well as any other similar directional terms refer to those directions of an electronic component holder equipped with the present invention. Accordingly, these terms, as utilized to describe the present invention should be interpreted relative to a remote control equipped with an electronic component holder with the present invention as used in the normal operating position. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only a preferred embodiment has been chosen to illustrate the present invention, it will be apparent to those skilled in the art from this disclosure that various changes and modifications can be made herein without departing from the scope of the invention as defined in the appended claims. Furthermore, the foregoing description of the preferred embodiment according to the present invention is provided for illustration only, and not for the purpose of limiting the invention as defined by the appended claims and their equivalents.

What is claimed is:

1. An electronic component holder comprising:
   a holder body with a first groove formed in a top face of the holder body and a second groove formed in a back face of the holder body that intersects with the top face, the first and second grooves being continuously formed and receiving a lead wire of an electronic component along the first and second groove; and
   a wire retaining portion formed in the second groove of the holder body, the wire retaining portion retaining the lead wire in the second groove and restricting movement of the lead wire in a direction away from a bottom face of the second groove of the holder body,
   the wire retaining portion including a protrusion protruding inwardly from one side face of the second groove towards the other side face of the second groove, with the protrusion and the other side face of the second groove defining a gap therebetween.

2. The electronic component holder according to claim 1, wherein
   the first groove extends longitudinally in the top face of the holder body, and
   the second groove extends substantially perpendicular to the first groove.

3. The electronic component holder according to claim 2, wherein
   the lead wire has a bent shape with a substantially right included angle and is disposed in the first and second grooves.

4. The electronic component holder according to claim 3, wherein
   the first groove forms an opening in a front face of the holder body that is opposite to the back face of the holder body with the lead wire being disposed through the opening.

5. The electronic component holder according to claim 1, wherein gap width at one end of the gap is greater than a diameter of the lead wire, and a gap width at the other end of the gap is less than the diameter of the lead wires.

6. The electronic component holder according to claim 5, wherein
   the protrusion is integrally molded along the second groove.

7. The electronic component holder according to claim 6, wherein
   the protrusion includes a sloped face that slopes downwardly and inwardly towards the other side face of the second groove.

8. An electronic component holder comprising:
   a holder body including
      a plurality of horizontal grooves formed horizontally in a top face of the holder body, the horizontal grooves receiving first parts of lead wires of an electronic component, the first parts of the lead wires being disposed in the horizontal grooves through openings formed in a front face of the holder body, and a plurality of vertical grooves formed vertically in a back face of the holder body, the vertical grooves receiving second parts of the lead wires of the electronic component, each of the lead wires having a bent shape with a substantially right included angle between the first and second parts; and a plurality of wire retaining portions formed in the vertical grooves of the holder body, the wire retaining portions retaining the lead wires in the vertical grooves and restricting movement of the lead wires in a direction away from a bottom face of the vertical grooves of the holder body, each of the wire retaining portions including a protrusion that is integrally molded along each of the vertical grooves and protrudes inwardly from one side face of each of the vertical grooves towards the other side face of each of the vertical grooves, the protrusion and the other side face of each of the vertical grooves defining gap therebetween, the protrusion having a sloped face that slopes downwardly and inwardly, each of the gaps having a gap width at one end of each of the gaps that is greater than a diameter of the lead wires and a gap width at the other end of each of the gaps that is less than the diameter of the lead wires.

* * * * *